United States Patent
Bucossi et al.

(10) Patent No.: US 6,731,134 B1
(45) Date of Patent: May 4, 2004

(54) TRI-STATE DELAY BOOST

(75) Inventors: William L. Bucossi, Burlington, VT (US); Bret R. Dale, Burlington, VT (US); Darin J. Daudelin, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,311

(22) Filed: Mar. 31, 2003

(51) Int. Cl.[7] .................. H03K 19/02; H03K 19/003; H03K 19/20
(52) U.S. Cl. ................ 326/56; 326/27; 326/121
(58) Field of Search ................ 326/56, 57–58, 326/86, 112, 119, 121, 27

(56) References Cited

U.S. PATENT DOCUMENTS

| | | | |
|---|---|---|---|
| 4,465,945 A | 8/1984 | Yin | 307/473 |
| 4,612,466 A | 9/1986 | Stewart | 307/585 |
| 5,332,932 A | 7/1994 | Runaldue | 307/443 |
| 5,367,645 A | * 11/1994 | Lubeck et al. | 710/305 |
| 5,483,179 A | 1/1996 | Dhong et al. | 326/88 |
| 5,491,436 A | 2/1996 | Austin | 327/108 |
| 5,592,104 A | * 1/1997 | Bach | 326/27 |
| 5,600,274 A | 2/1997 | Houston | 327/262 |
| 6,066,958 A | 5/2000 | Taniguchi et al. | 326/27 |
| 6,118,303 A | 9/2000 | Schmitt et al. | 326/83 |
| 6,281,719 B1 | 8/2001 | Ho et al. | 327/108 |
| 6,346,828 B1 | * 2/2002 | Rosen et al. | 326/56 |
| 6,348,814 B1 | 2/2002 | Peterson | 326/58 |
| 6,351,172 B1 | 2/2002 | Ouyang et al. | 327/333 |

FOREIGN PATENT DOCUMENTS

JP 01189224 A * 7/1989 .......... H03K/19/00

* cited by examiner

Primary Examiner—James A. Cho
(74) Attorney, Agent, or Firm—Downs Rachlin Martin PLLC

(57) ABSTRACT

A driver including boost circuitry for reducing tri-state delay. Boost circuitry includes boost legs (32) and (34) having boost delay chains (38) and (40), respectively. Sub-circuits (35) and (39) may include a series of inverters or other devices to delay a tri-state enable signal (EN2) or (EN2BAR) for a predetermined amount of time substantially equivalent to the time it takes for a first signal (A2) to travel from input pin A to PAD. Transient current provides a boost by discharging or charging output nodes (G1) and (G2), respectively. Boost legs (32) and (34) remain on for the length of time it takes for enable signal (EN2) or (EN2BAR) to travel through subcircuits (35) and (39). The boost increases the rate of transition of output nodes (G1) and (G2) thereby reducing the delay of tri-state signal (EN2).

20 Claims, 5 Drawing Sheets

TRI-STATE DELAY BOOST

BACKGROUND OF INVENTION

1. Field of the Invention

The present invention relates to dual supply off chip driver circuits, and in particular to tri-state delay boost circuitry.

2. Background of the Invention

When driving off chip, there are three valid states: logic 0; logic 1; and tri-state. Tri-state means the driver in question is not driving a logic 0 or logic 1. The term tri-state can be used to describe the state of a particular driver connected to a bus. In addition, a driver that is in tri-state (as opposed to logic 0 or logic 1) is analogous to being in a stand-by mode.

FIGS. 1 and 2 illustrate prior art applications of tri-state circuitry. A typical dual supply driver circuit 10 is illustrated in FIG. 1. As used herein, the driver is the portion of an input/output (I/O) sending signals off a chip. The driver is connected to the bus and drives signals onto the bus. The tri-state portion 12 of circuit 10 is used to create and manipulate signal EN2 (depending on input values at pins TS and D1), which are further manipulated to signal the driver to turn on or off. When the driver is tri-stated, it is electrically disconnected from the bus.

In addition to signal EN2, signal A2 is also provided based on an input value at pin A. A2 provides a logic 0 or logic 1 value to an output stage 14 (node G1 or G2, which in turn sends, the logic value to PAD). The value at PAD is sent from the chip when the driver is on.

In determining the signals that go to output stage 14 and ultimately PAD, signals EN2 and A2 are processed through a pre-drive stage 16 having circuitry that includes a NAND gate 18 and a NOR gate 20. In FIGS. 1 and 2, signals EN2 and A2 are processed through NAND gate 18, and signals EN2BAR (inverse of signal EN2) and A2 are processed through NOR gate 20. FIG. 2 illustrates a circuit 24, which includes a typical NAND/NOR predriver (as illustrated in the FIG. 1 schematic).

In a prior art NAND/NOR driver as in FIGS. 1 and 2, the tri-state signal delay (i.e., time it takes for a signal generated from input values at pins TS and D1 to travel to PAD) is greater than the driver critical path delay (i.e., time it takes for a signal generated by the input value at pin A to travel to PAD). The tri-state signal experiences a longer delay because it must travel through an additional stage of logic (NAND gate 212 at tri-state portion 12) as compared to the input value at pin A. As a result, in most I/O's, turning a bus on/off or tri-stating the bus, inherently takes longer than switching from a logic 0 to logic 1 or logic 1 to logic 0.

Many applications require tri-state delays that are equivalent to driver critical path delay. Such a requirement is even more important with zero-bus-turnaround applications where the driver is tri-stated and the receiver enabled or the receiver disabled and driver enabled all in the same cycle. Additionally, the Peripheral Component Interconnect and Peripheral Component Interconnect Extended (PCI/PCIX) specification imposes output signal slew rate restrictions thereby making it more difficult to achieve a tri-state delay equivalent to the critical path delay when interfacing a particular chip to a PCI/PCI-X bus.

SUMMARY OF INVENTION

One aspect of the present invention is a driver for driving output to a pad including boost circuitry for reducing tri-state delay. The driver includes at least one NAND gate predriver circuit, at least one NOR gate predriver circuit, at least one first boost leg for providing a boost current to each of the at least one NAND gate predriver circuit during turn on of each of the NAND gate predriver circuits, and at least one second boost leg for providing a boost current to each of the at least one NOR gate predriver circuits during turn on of each of the NOR gate predriver circuits.

Another aspect of the present invention is a method of decreasing the time it takes for a tri-state signal to travel to a pad. The method includes the steps of providing at least one NAND gate predriver circuit, providing at least one NOR gate predriver circuit, providing at least one output node in communication with the at least one NAND gate predriver circuit, the at least one NOR gate predriver circuit, and the pad, providing at least one boost leg each having at least one subcircuit with a first end and a second end, the second end in communication with the at least one NAND gate predriver circuit and the at least one NOR gate predriver circuit, providing at least one first input for providing a first signal to each of the predriver circuits, providing at least one enable signal from a tri-state circuit, the at least one enable signal for providing either on enable signals or off enable signals to each of the predriver circuits and each of the at least one boost leg first ends, the on enable signals turning on said predriver circuits and the off enable signals turning off the predriver circuits, and allowing at least one of the at least one output node to discharge or charge upon receipt of the on or off enable signal by the at least one boost leg.

BRIEF DESCRIPTION OF DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 2:
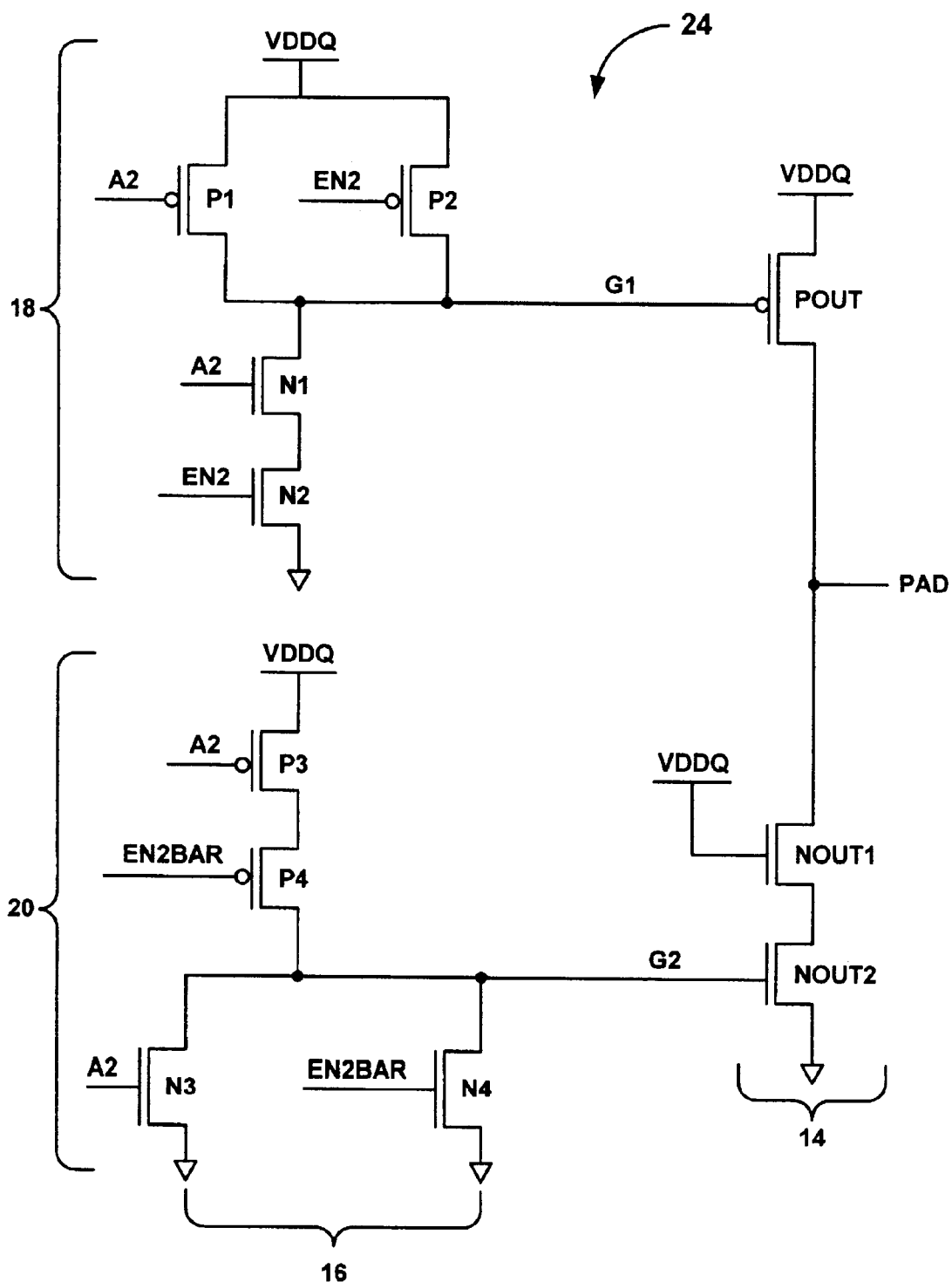
FIG. 2 is a mosfet level diagram of a prior art predrive circuit including a NAND and a NOR configuration.

The present invention is circuitry for providing a boost to typical pre-drive NAND and NOR circuitry used in a typical PAD driver circuit. The boost reduces both tri-state to active and active to tri-state delays. In both cases, the boost includes one or more boost legs, each having a series of inverters or other devices. The output node is either discharged or charged for a predetermined time that it takes for the respective enable signal to travel through the respective boost leg subcircuits (35, 39). The present invent ion allows an I/O to turn on or off in the same amount of time it takes for it to switch from logic 0 to logic 1, or vice versa, by providing a boost that increases the rate of transition from the output stage (nodes G1 and G2 in FIGS. 2 and 3) to PAD.

Figure 1:
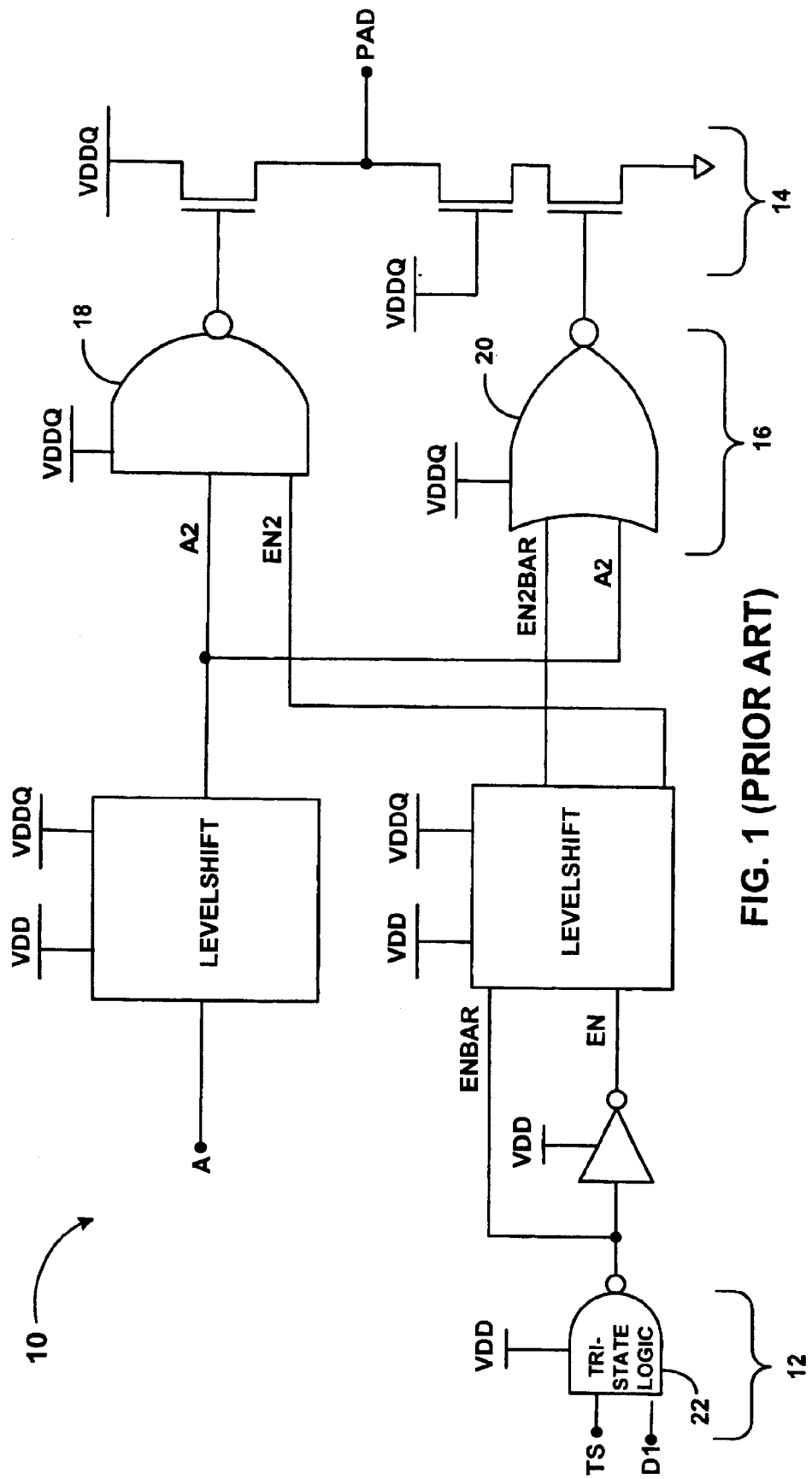
FIG. 1 is a diagram of a prior art dual supply PAD driver circuit.
Figure 3:
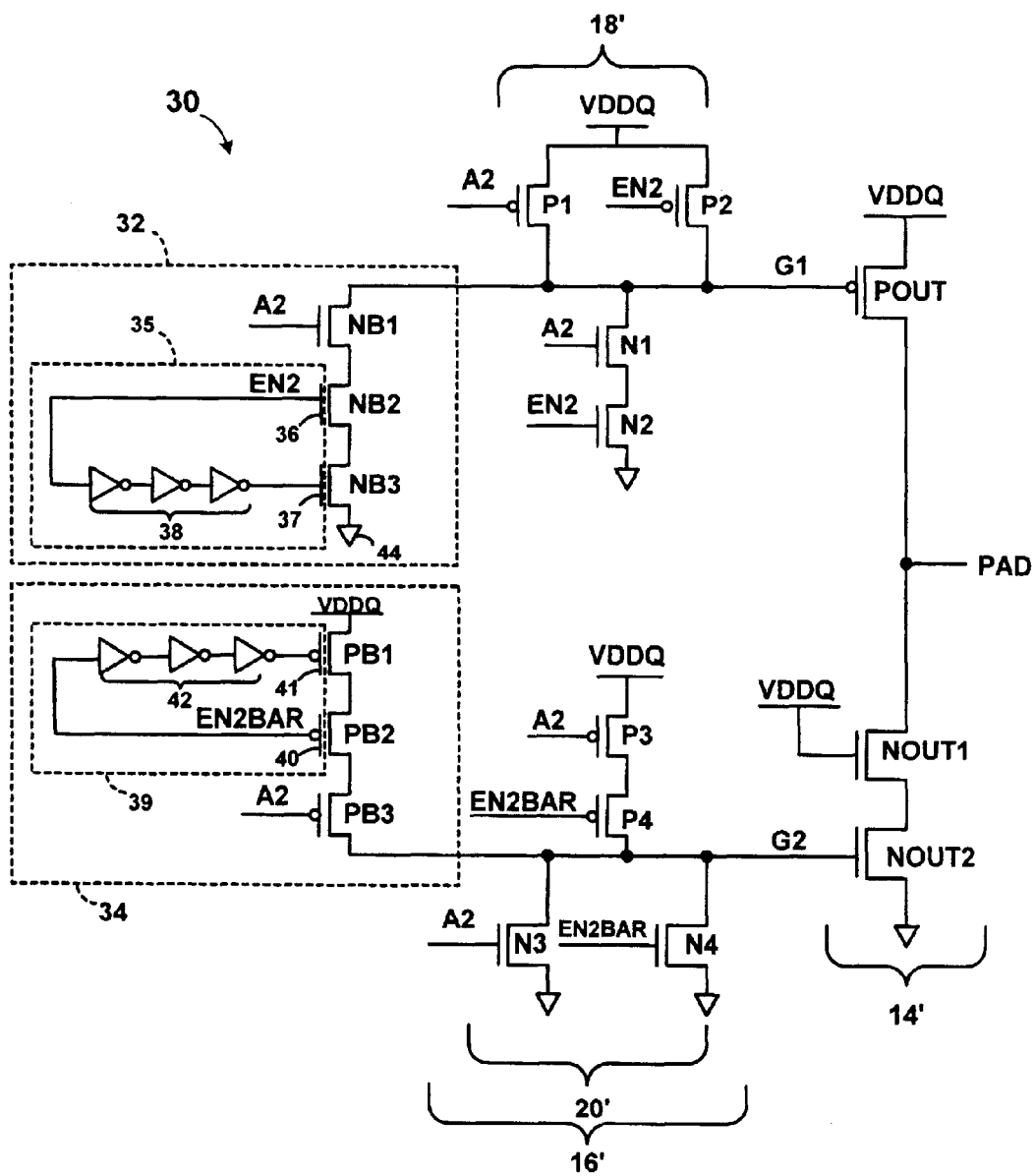
FIG. 3 is a circuit diagram of an embodiment of the present invention including boost legs for decreasing tri-state to active delays.
Figure 4:
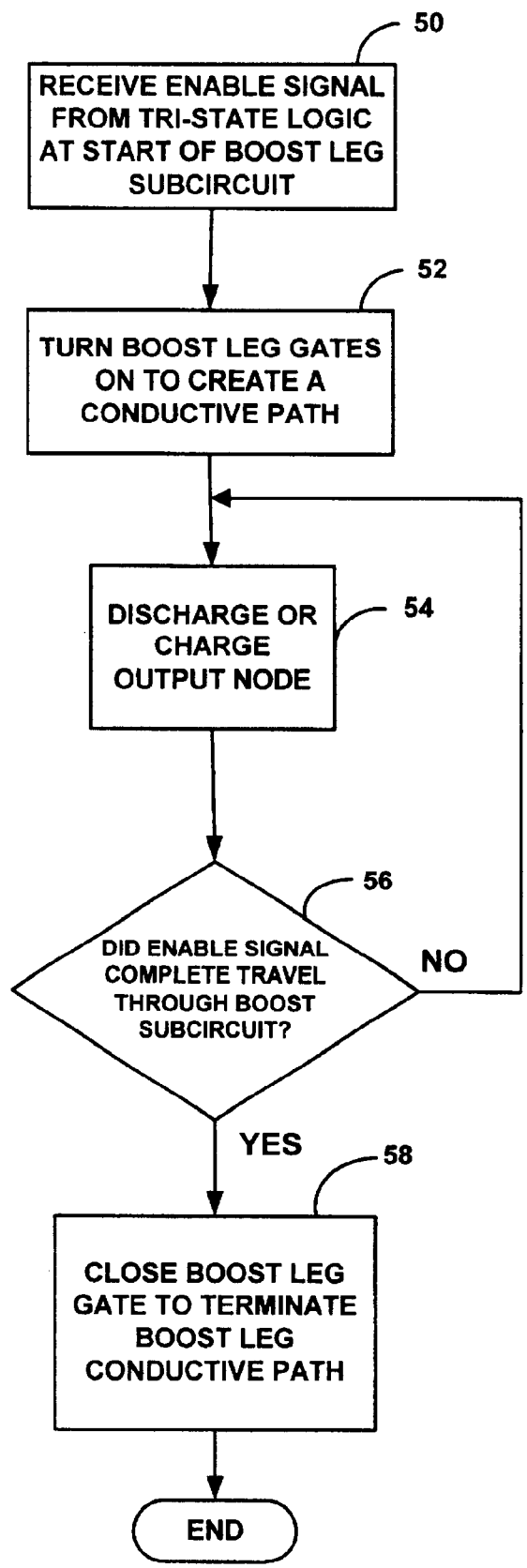
FIG. 4 is a flowchart of the flow of logic through the circuit illustrated in FIG. 3.
Figure 5:
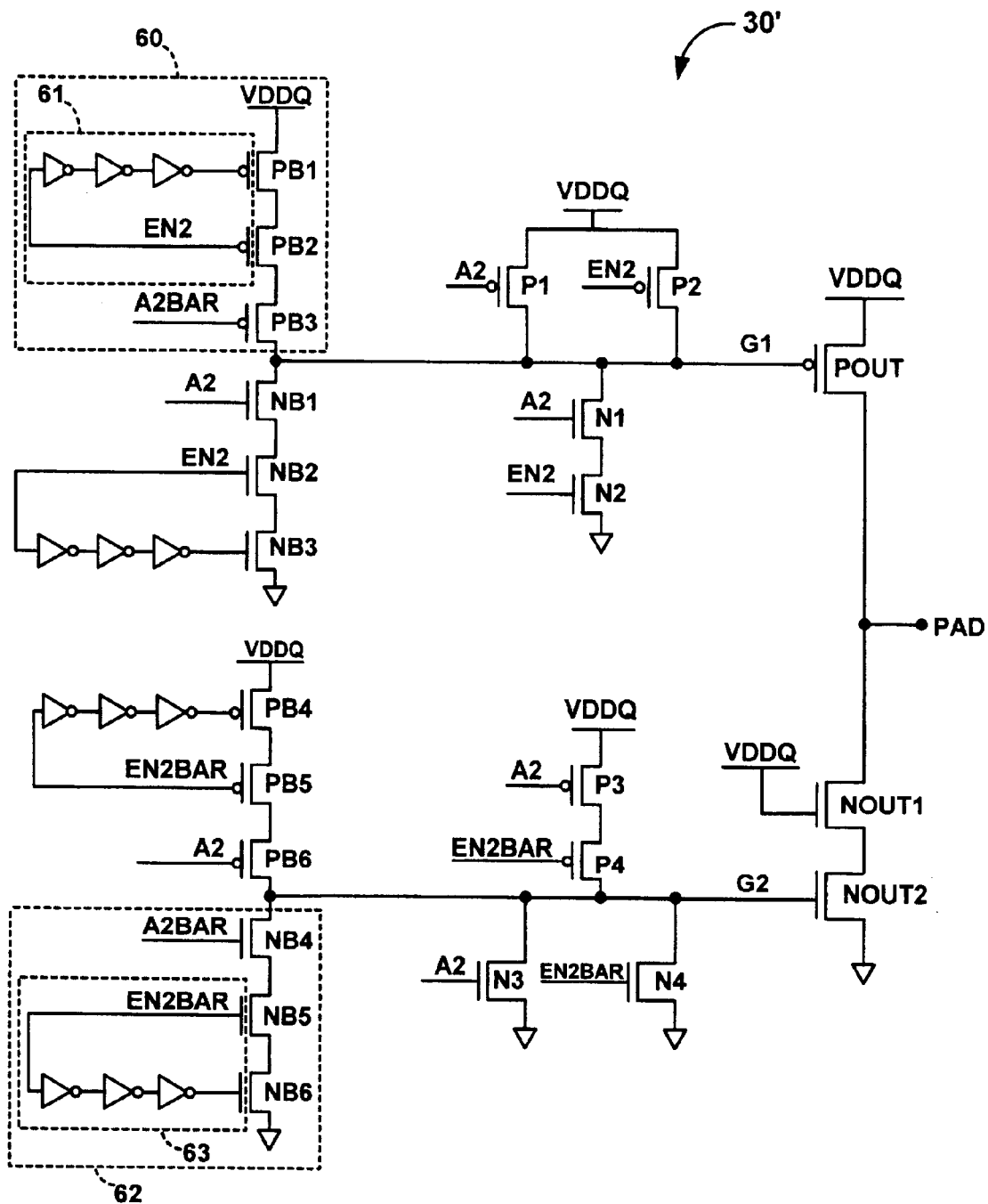
FIG. 5 is a circuit diagram of an embodiment of the present invention including boost legs for both decreasing tri-state to active delays and active to tri-state delays.

FIGS. 3–5 illustrate embodiments of the present invention including tri-state boost legs. Like elements or aspects of the prior art circuits illustrated in FIGS. 1 and 2 and the circuits of the present invention are indicated with like element numbers. Referring to FIG. 3, a circuit 30 represents an embodiment of the present invention for reducing the tri-state to active delay. Boost legs 32 and 34 (designated by dashed lines) are paired with NAND gate 18' and NOR gate 20', respectively, of pre-drive stage 16' to increase the rate of transition of nodes G1 and G2, also respectively.

Boost leg 32 includes a subcircuit 35 having a first end 36 and a second end 37. In the embodiment illustrated in FIG. 3, subcircuit 35 includes a delay chain 38 having a series of three inverters between first end 36 and second end 37. Boost leg 32 also includes n-channel field effect transistors (NFETS) NB1, NB2, and NB3 in series. First end 36 is input to NFET NB2 and second end 37 is input to NFET NB3. Signal EN2 is received by both first end 36 and NFET NB2. Signal A2 is received by NFET NB1.

Boost leg 34 includes a subcircuit 39 having a first end 40 and a second end 41. In the embodiment illustrated in FIG. 3, subcircuit 39 includes a delay chain 42 having a series of three inverters between first end 40 and second end 41. Boost leg 34 also includes p-channel field effect transistors (PFETS) PB1, PB2, and PB3 in series. First end 40 is input to PFET PB2 and second end 41 is input to PFET PB1. Signal EN2BAR is received by both first end 40 and PFET PB2. Signal A2 is received by PFET PB3.

Both signals A2 and EN2 are used to determine the final logic states of nodes G1 and G2. The NAND, which controls the gate of PFET POUT, and NOR, which controls the gate of NFET NOUT2, are where signals A2 and EN2 are logically mated. The tri-state boost circuitry increases the rate at which nodes G1 and G2 change states when the change is caused by the EN2 and EN2BAR signals.

When driving logic 1 on PAD, boost leg 32 increases the rate of transition of node G1 by creating a conductive path to ground. Node G1 is thus caused to discharge or is pulled to logic 0 faster than normal. Referring to boost leg 32 of FIG. 3, initially, node A2=1, node EN2=0, and the gate of NB3=1. At time t=0, EN2 begins to switch from 0 to 1. As a result, NFET NB2 turns on. After NB2 turns on, NFETS NB1, NB2, and NB3 are all on thereby creating a conductive path to ground 44. As mentioned above, this discharges or pulls node G1 to logic 0 faster than normal. At the same time these three N-type devices are on, the changing EN2 signal is propagating through subcircuit 35 (part of boost leg 32) connected to NB3. Finally, the gate of NB3 changes to logic 0 thus turning the device off and closing the conductive path to ground 44. The boost provided by the conductive path to ground 44 is only on for a time equal to the propagation delay through subcircuit 35. As mentioned above, in at least one embodiment, subcircuit 35 includes a delay chain 38 having a series of three inverters.

Referring to boost leg 34 of FIG. 3, when driving a logic 0 on PAD, boost leg 34 increases the rate of transition of node G2 by creating a conductive path to G2 from VddQ. Initially, node A2=0, node EN2BAR=1, and the gate of PB1=0. At time t=0, EN2BAR begins to switch from 1 to 0. As a result, PFET PB2 turns on. After PB2 turns on, PFETS PB1, PB2, and PB3 are all on thereby creating a conductive path for VDDQ to charge G2. As mentioned above, this charges or pulls node G2 to logic 1 faster than normal. At the same time these three P-type devices are on, the changing EN2BAR signal is propagating through a subcircuit 40 (part of boost leg 34) connected to PB1. Finally, the gate of PB1 changes to 1, thus turning the device off and closing the conductive path from VDDQ to G2. The boost provided by the conductive path to G2 is only on for a time equal to the propagation delay through subcircuit 40.

Another aspect of the invention is a method of providing a tri-state delay boost. FIG. 4 illustrates the steps of one embodiment of a method of providing a tri-state delay boost. As illustrated at step 50, first an enable signal generated by tri-state logic is received at the start of a boost delay chain in a boost leg similar to or the same as those illustrated in FIGS. 2 and 3.

Next, at step 52, based on the signal transmitted, all the transistors of the boost leg are turned on thereby creating a conductive path through the gates to an output node. Then, in step 54, the discharge node is either charged or discharged. In the case of a NAND gate or when driving a logic 1 at PAD, the conductive path is from the output node to ground thereby discharging the output node. In the case of a NOR gate or when driving a logic 0 at PAD, the conductive path is from a voltage source to the output node thereby charging the output node.

Next, at step 56, it is determined whether the enable signal received in step 50 has traveled to the end of the boost delay chain. If it has not reached the end of the boost delay chain, the transistors of the boost leg remain on thereby maintaining a conductive path between either ground and the output node or a voltage source and the output node. When the enable signal reaches the end of the boost delay chain, the method continues to step 58 where the transistor connected to the end of the boost delay chain is off thereby causing the conductive path formed through the boost leg transistors to close. As a result, either the discharge to ground or the charge to the output node is terminated and the method ends.

In another embodiment of the present invention, multiple boost legs for boosting both tri-state to active signal transitions and active to tri-state signal transitions are provided in circuit 30'. As illustrated in FIG. 5, such an embodiment may be created by adding additional boost legs 60 and 62 to circuit 30 in FIG. 3.

In the circuits according to FIG. 5, the driver is switched from tri-state to active as described above with respect to FIG. 3. As described more fully below, conversely, the driver is switched from an active mode to a tri-state/stand-by mode by driving logic 1 at node G1 and logic 0 at node G2. This is due to the fact that in the embodiment illustrated in FIG. 5, the signal at node G1 is transferred to PAD via PFET POUT and the signal at node G2 is transferred to PAD via NFET NOUT2. When G1=logic 1 and G2=logic 0, both PFET POUT and NFET NOUT2, respectively, are turned off and the circuit is said to be in stand-by mode or tri-state.

Still referring to FIG. 5, initially signal EN2=logic 1, A2BAR (inverse of signal A2) =logic 0, node G1=logic 0, and PAD=logic 1. When EN2 changes from logic 1 to logic 0, PFETS PB1, PB2, and PB3 are all on, thus aiding in the charging of node G1 to logic 1. As explained above with respect to circuit 30 in FIG. 3, PFET PB1 in circuit 30' is only on for a time equal to the propagation delay through boost delay chain 61. Once the change in EN2 propagates through boost delay chain 61, the boost provided by boost leg 60 is turned off.

Transistor POUT is turned off by setting node G1 to logic 1. The active to tri-state circuitry (i.e., PFETS PB1, PB2, and PB3) helps change the logic value of node G1 faster. Of course, because it is only desirable to enable the circuitry of boost leg 60 when signal A2BAR=logic 0 and signal EN2= logic 0, these signals are connected to PFET PB2 and PB3, respectively. As also explained above, the PFETS that make up boost leg 60 are only on when their logic value is less than or equal to 0. In addition, because the transistors in boost leg 60 are in series, the boost leg is only on when all three transistors (PFETS PB1, PB2, and PB3) are on.

Referring specifically to boost leg 62 in FIG. 5, initially signal EN2BAR=logic 0 (inverse of signal EN2), signal A2BAR=logic 1 (inverse of signal A2), node G2=logic 1, and PAD=logic 0. When EN2BAR changes from logic 0 to logic 1, NFETS NB4, NB5, and NB6 are all on, thus aiding in the discharging of node G1 to logic 0. Again, similar to boost leg 60 and boost delay chain 61, NFET NB6 is only on for a time equal to the propagation delay through boost delay chain 63. Once the change in EN2BAR propagates through boost delay chain 63, the boost provided by boost leg 62 is turned off.

Transistor NOUT is turned off by setting node G2 to logic 0. The active to tri-state circuitry (i.e., NFETS NB4, NB5, and NB6) helps change the logic value of node G2 faster. As also explained above with regard to boost leg 60, it is only desirable to turn boost leg 62 on if signal A2BAR=logic 0 and signal EN2BAR=logic 1. Accordingly, signals A2BAR, and EN2BAR are connected to NFETS NB5 and NB6, respectively, of boost leg 62. As also explained above, the NFETS that make up boost leg 62 are only on when their logic value is greater than 0. In addition, because the NFETS in boost leg 62 are in series, the boost leg is only on when all three transistors (NFETS NB4, NB5, and NB6) are on.

As mentioned above, in all embodiments of the present invention, each boost leg is on for a period equal to the signal delay through the inverters in each boost delay chain. Of course, in other embodiments, the number of inverters in each boost delay chain may be varied to change the amount of time each boost leg is on. In addition, other devices such as additional alternative types of gates and/or transistors may be included in each boost delay chain in addition to or in conjunction with inverters. The number of inverters and/or other devices in each boost delay chain is selected based on the delay time for switching logic conditions from 0 to 1. Optimally, the delay time for the tri-state signal will equal the driver critical path signal delay.

For all embodiments of the present invention, the effective on time of each boost leg may be further adjusted by modifying the W/L ratios (i.e., gate channel width/gate channel length) of each inverter in each boost leg. In addition, the magnitude of boost current (either charging or discharging) may be adjusted by modifying the W/L ratios of each gate (other than inverters) of each transistor in each boost leg.

The present invention allows an I/O to turn on or off in the same amount of time it takes for it to switch from logic 0 to logic 1, or vice versa, by increasing the rate of transition from the output stage (nodes G1 and G2 in FIGS. 2, 3, and 5) to PAD. If the delay time for turning an I/O on or off is equivalent to the delay time for switching logic conditions from 0 to 1 or vice versa, less time is required to resume communication when the I/O is turned on or off.

While the present invention has been described in connection with specified embodiments, it will be understood that it is not so limited. On the contrary, it is intended to cover all alternatives, modifications and equivalents as may be included within the spirit and scope of the invention as defined in the appended claims.

What is claimed is:

1. A driver for driving output to a pad including boost circuitry for reducing tri-state delay, comprising:
   at least one NAND gate predriver circuit;
   at least one NOR gate predriver circuit;
   at least one first boost leg for providing a boost current to each of said at least one NAND gate predriver circuits during turn on of each of said NAND gate predriver circuits; and
   at least one second boost leg for providing a boost current to each of said at least one NOR gate predriver circuits during turn on of each of said NOR gate predriver circuits.

2. A driver as in claim 1, wherein each of said at least one first and second boost legs have at least one subcircuit including a delay chain having at least two inverters in series.

3. A driver as in claim 2, wherein said boost current is provided for a first time period substantially equal to the time it takes for a logic signal to flow through said at least one subcircuit.

4. A driver as in claim 3, wherein W/L ratios of said at least two inverters are selected to set said first time period to a desired duration.

5. A driver as in claim 3, further comprising at least one first input for receiving a first signal to be provided to each of said predriver circuits, wherein said first time period is substantially equivalent to a second time period defined by the time it takes for said first signal to travel from said at least one first input to the PAD.

6. A driver as in claim 3, wherein at least one of said first and second boost legs include a means for increasing and decreasing said first time period.

7. A driver as in claim 2, wherein W/L ratios of said at least two inverters in said at least one first and second boost legs are selected to control a magnitude of said boost current.

8. A driver as in claim 1, wherein each of said at least one boost leg are in parallel with said at least one NAND gate predriver circuit or said at least one NOR gate predriver circuit.

9. A driver as in claim 1, wherein said at least one NAND gate predriver circuit and said at least one NOR gate predriver circuit turn on in response to receipt of an enable signal.

10. A driver as in claim 1, wherein said at least one NAND gate predriver circuit and said at least one NOR gate predriver circuit turn off in response to receipt of an enable signal.

11. A driver for driving output to a pad including boost circuitry for reducing tri-state delay, comprising:
    at least one NAND gate predriver circuit, each of said predriver circuits in communication with either an on enable signal or an off enable signal from a tri-state circuit;
    at least one NOR gate predriver circuit each of which are in parallel with said at least one NAND gate predriver circuit, each of said predriver circuits in communication with either an on enable signal or an off enable signal from a tri-state circuit;
    at least one output node in communication with said at least one NAND gate predriver circuit, said at least one NOR gate predriver circuit, and the pad;
    at least one boost leg each having at least one subcircuit with a first end and a second end, said second end in communication with said at least one NAND gate predriver circuit and said at least one NOR gate predriver circuit, said first end in communication with an on or off enable signal from a tri-state circuit;
    at least one first input for receiving a first signal to be provided to each of said predriver circuits; and
    wherein said at least one boost leg allows at least one of said at least one output node to discharge or charge upon receipt of the on or off enable signal.

12. A driver as in claim 11, wherein each of said at least one subcircuits has a delay chain that includes at least two inverters in series.

13. A driver as in claim 12, wherein at least one of said first and second boost legs include a means for increasing and decreasing said first time period.

14. A driver as in claim 11, wherein said at least one output node is charged or discharged for a first time period substantially equal to the time it takes for the on enable signal or the off enable signal to flow between said first end, through said inverters, and to said second end of said at least one subcircuits.

15. A driver as in claim 14, wherein W/L ratios of said at least two inverters are selected to set said first time period to a desired duration.

16. A driver as in claim 14, wherein said first time period is substantially equivalent to a second time period defined by the time it takes for said first signal to travel from said at least one first input to said PAD.

17. A driver as in claim 11, wherein each of said at least one boost leg are in parallel with said at least one NAND gate predriver circuit or said at least one NOR gate predriver circuit.

18. A driver as in claim 11, wherein said on enable signals and said off enable signals are independent of one another.

19. A driver as in claim 11, wherein said on enable signals and said off enable signals are timed independent of one another.

20. A method of decreasing the time it takes for a tri-state signal to travel to a pad comprising the steps of:

providing at least one NAND gate predriver circuit;

providing at least one NOR gate predriver circuit;

providing at least one output node in communication with said at least one NAND gate predriver circuit, said at least one NOR gate predriver circuit, and the pad;

providing at least one boost leg each having at least one subcircuit with a first end and a second end, said second end in communication with said at least one NAND gate predriver circuit and said at least one NOR gate predriver circuit;

providing at least one first input for providing a first signal to each of said predriver circuits;

providing at least one enable signal from a tri-state circuit, said at least one enable signal for providing either on enable signals or off enable signals to each of said predriver circuits and each of said at least one boost leg first ends, said on enable signals turning on said predriver circuits and said off enable signals turning off said predriver circuits; and allowing at least one of said at least one output node to discharge or charge upon receipt of said on or off enable signal by said at least one boost leg.

* * * * *